(12) United States Patent
Lykins et al.

(10) Patent No.: US 6,440,641 B1
(45) Date of Patent: Aug. 27, 2002

(54) DEPOSITED THIN FILM BUILD-UP LAYER DIMENSIONS AS A METHOD OF RELIEVING STRESS IN HIGH DENSITY INTERCONNECT PRINTED WIRING BOARD SUBSTRATES

(75) Inventors: James L. Lykins, San Jose; Jan I. Strandberg, Cupertino, both of CA (US)

(73) Assignee: Kulicke & Soffa Holdings, Inc., Willow Grove, PA (US)

( * ) Notice: Subject to any disclaimer, the term of this patent is extended or adjusted under 35 U.S.C. 154(b) by 0 days.

(21) Appl. No.: 09/172,178

(22) Filed: Oct. 13, 1998

Related U.S. Application Data

(63) Continuation-in-part of application No. 09/127,579, filed on Jul. 31, 1998, now Pat. No. 6,203,967.

(51) Int. Cl.[7] .................................................. G03F 7/00
(52) U.S. Cl. ...................... 430/315; 430/311; 430/313; 430/317
(58) Field of Search ................................. 430/311, 313, 430/315, 317

(56) References Cited

U.S. PATENT DOCUMENTS

| | | | |
|---|---|---|---|
| 4,695,868 A | 9/1987 | Fisher ........................... | 357/68 |
| 4,761,303 A * | 8/1988 | Ruszczyk ...................... | 427/96 |
| 4,830,691 A | 5/1989 | Kida et al. ................... | 156/631 |
| 4,847,146 A | 7/1989 | Yeh et al. .................... | 428/332 |
| 4,871,316 A | 10/1989 | Herrell et al. ................ | 439/66 |
| 4,970,577 A | 11/1990 | Ogihara et al. ................ | 357/74 |
| 5,108,825 A | 4/1992 | Wojnarowski et al. ...... | 428/209 |
| 5,126,192 A | 6/1992 | Chellis et al. .............. | 428/323 |
| 5,135,556 A | 8/1992 | Hornback et al. ............. | 65/43 |
| 5,266,525 A | 11/1993 | Morozumi ................... | 437/195 |
| 5,274,270 A | 12/1993 | Tuckerman ................. | 257/758 |
| 5,376,435 A | 12/1994 | Morozumi ................... | 428/210 |
| 5,393,864 A * | 2/1995 | Summers ..................... | 528/353 |
| 5,451,721 A | 9/1995 | Tsukada et al. ............. | 174/261 |
| 5,473,120 A | 12/1995 | Ito et al. ..................... | 174/264 |
| 5,488,542 A | 1/1996 | Ito ............................... | 361/793 |
| 5,514,624 A | 5/1996 | Morozumi ................... | 437/195 |
| 5,751,552 A | 5/1998 | Scanian et al. ............. | 361/707 |
| 5,763,123 A | 6/1998 | Shishido et al. .............. | 430/30 |
| 5,945,203 A * | 8/1999 | Soane .......................... | 428/209 |
| 6,203,967 B1 * | 3/2001 | Westbrook .................. | 430/313 |

FOREIGN PATENT DOCUMENTS

| | | |
|---|---|---|
| EP | 0 602 258 A1 | 6/1994 |
| JP | 6-188568 | 7/1994 |

* cited by examiner

Primary Examiner—Mark F. Huff
Assistant Examiner—Nicole Barreca
(74) Attorney, Agent, or Firm—Townsend and Townsend and Crew LLP

(57) ABSTRACT

The present invention provides a method for controlling the mechanical stresses at the interfaces of the metal and dielectric materials in the printed wiring substrates of high density interconnects. The invention enables the minimization of cracking due to these stresses and does so in an economically attractive process that is able to meet the needs of today's high density interconnect applications. In one embodiment, the method of the present invention dispenses mechanical stresses in a high density interconnect printed wiring board substrate having a first patterned conductive layer formed over an upper surface of the substrate. The patterned conductive layer includes multiple conductive lines each having edges that define the boundaries of the conductive lines. The method of the invention forms a composite dielectric layer over the first patterned conductive layer and between the edges of the conductive layer. The composite dielectric layer includes particles suspended in the layer in order to reduce the likelihood and prevent any cracks that form in the layer from propagating through the entire length of the layer. A thin film conductive layer is then formed over the composite dielectric layer, and a thin film dielectric layer is formed over the thin film conductive layer. In a preferred embodiment, the composite dielectric layer is a CIBA PROBIMER™ layer deposited from a curtain coating process.

30 Claims, 5 Drawing Sheets

DEPOSITED THIN FILM BUILD-UP LAYER DIMENSIONS AS A METHOD OF RELIEVING STRESS IN HIGH DENSITY INTERCONNECT PRINTED WIRING BOARD SUBSTRATES

This is a continuation-in-part of Westbrook et al. U.S. Pat. No. application Ser. No. 09/127,579, now U.S. Pat. No. 6,203,967 filed Jul. 31, 1998.

BACKGROUND OF THE INVENTION

The present invention relates to the use of thin film deposition technology to create high density interconnects on a conventional printed wiring board substrate. More specifically, the present invention pertains to an improved method for minimizing the effects of accumulated stress between the printed wiring board substrate and the overlying deposited thin film layers. The method of the present invention can be used with or without conventional build-up layers and/or an initial conventional build-up layer and is useful for high density integrated circuit packaging of single chip, multi-chip, and support components such as resistors and capacitors. The method of the present invention is also useful for creating interconnections on high density daughter boards that carry packaged devices.

The semiconductor industry continues to produce integrated circuits of increasing complexity and increasing density. The increased complexity of some of these integrated circuits has in turn resulted in an increased number of input/output pads on the circuit chips. At the same time, the increased density of the chips has driven the input/output pad pitch downward. The combination of these two trends has been a significant increase in the connector pin wiring density needed to connect the chips to packages that interface with the outside world and interconnect the chips to other integrated circuit devices.

A number of different technologies have been developed to interconnect one or more integrated circuits and related components. One such technology is based on traditional printed wiring board (PWB) technology that found wide use during the period in which integrated circuits were packaged in surface mount devices like quad flat packs (QFPs). When used to interconnect multiple integrated circuits this PWB technology is often referred to as MCM-L or laminate MCM technology. PWB technology typically uses copper and insulating dielectric material sub-laminates as building blocks to create the required interconnect structures. The process of forming a copper conductive pattern on the sub-laminate in PWB technology typically includes forming a dry film of photo resist over the copper layer, patterning and developing the photo resist to from an appropriate mask and selectively etching away the unwanted copper thereby leaving the desired patterned conductive layer.

Substrates used in PWB technology can be manufactured in large area panels providing efficiencies that lower the costs of production. Interconnect solutions using this technology generally have relatively good performance characteristics because of the copper and low dielectric constant (e.g. less than or equal to 4.0) employed. The printed wiring board industry, however, has not kept pace with the advances in semiconductor manufacturing in terms of pad density and pad count. As a result, there is a capability gap between semiconductor manufacturers and interconnect printed wiring board manufactures.

In some applications, two or more pieces of laminate are laminated together to form a final structure. Interconnection between laminated layers can be provided by through hole mechanical drilling, followed by plating. The drilling process is relatively slow and expensive and can require a large amount of board space. As the number of interconnect pads increases, an increased number of signal layers is often used to form the interconnect structure. Because of these limitations, the conventional printed wiring board technology needs to go to a large number of metal layers (e.g. greater than eight layers) for some of the applications in high density integrated circuit packaging and daughter board fabrication. Utilizing a large number of layers in this context generally increases cost and decreases electrical performance. Also, the pad size limits the wiring density on any given layer with this technology. Thus, PWB technology, while useful for some applications, is not capable of providing the connection density required in other applications. To improve the interconnect density of PWB technology, an advanced printed wiring board technology approach called build-up multi-layer has been developed. In this technology a traditional printed wiring board core is the starting point. Standard drilling and plating techniques are used to form plated through holes in the core. From the basic core this build-up approach has many variations. Typically a dielectric layer approximately 50 microns thick is laminated to both the top and bottom major surfaces of the conventionally fabricated printed wiring board substrate. Vias are made in the build-up layer by laser ablation, photo mask/plasma etch, or other known methods. An electroless seeding step is then done prior to a panel plating step that metalizes both the upper and lower surfaces. Subsequent masking and wet etching steps then define a desired conductive pattern over the laminated dielectric layers.

This technology offers a large improvement in terms of density over standard PWB technology without build-up layers; however, such build-up boards require multiple layers in order to meet the developing high density packaging and daughter board requirements. Thus this technology still has limitations.

Another conventional approach used to package high density interconnect applications uses cofired ceramic substrates and is referred to generally as multilayer ceramic or MLC technology or as MCM-C, cofired ceramic MCM and thick film MCM technology in the multichip module context. Basically, MLC technology involves rolling a ceramic mix into sheets, drying the sheets, punching vias, screening the rolled sheets with a metal paste representing the trace pattern on the surface of the ceramic, stacking and laminating all the layers together, then cofiring at a high temperature (e.g. greater than 850° C.) to achieve the desired interconnections.

MLC construction has found extensive use in high density and high reliability products where the robustness of the high density interconnect package outweighs the cost considerations. The ability to create a hermetic seal in the ceramic improves the ability to withstand environments not tolerable to conventional printed wiring board technology. While this technology is capable of high density packaging applications (e.g. greater than 1000 pads), it is also very costly. Additionally, performance characteristics, such as signal propagation time, are impacted due to the relatively high dielectric constant (e.g. between 5.0 and 9.0) of the ceramic material. MLC technology provides higher connection density than PWB technology, but is not capable of providing the connection density required for some of today's high density interconnect applications.

A third approach which the high density interconnect and packaging industry has moved toward to address these high density interconnect applications uses thin film deposition technology and is sometimes referred to as deposited on laminate or DONL technology in a broad sense and as MCM-D or MCM deposition technology in a multichip module context. In some applications, such DONL technology includes forming and patterning thin film conductive traces over large substrates such as the laminated printed wiring boards discussed above. Such large substrates may have a surface area of 40 centimeters by 40 centimeters or more, thereby providing efficiencies that lower the costs of production.

DONL technology utilizes a combination of low cost printed wiring board structures, with or without the use of the build-up multi-layers on the printed wiring board, as a starting point to meet the high density and low cost interconnect requirements. This combination of existing conventional high volume printed wiring board technology and advanced thin film deposition technology represents a significant economic advantage and density improvement as compared to the previously discussed PWB and MLC technologies.

One significant feature of DONL technology is that it creates a high interconnect density substrate using thin film processes on only one side of the printed wiring board. The high density interconnects are formed by depositing alternating conducting and insulating thin film layers. The total thickness of several of these deposited layers is less than the thickness of a single traditional build-up layer. This eliminates the need for balancing the build-up layers on both top and bottom to prevent warpage of the substrate.

The DONL process involves first laying down a layer of an insulating dielectric on the top surface of a printed wiring board substrate, depositing a conductive material over the dielectric layer, creating a circuit pattern in the conductive material, then depositing the next insulating and conductive layers. The various layers so created are connected through vias constructed using a variety of known techniques such as wet chemical etch, photo expose and develop or laser ablation. In this way a three dimensional deposited laminated structure is achieved enabling high density interconnect patterns to be fabricated in small physical areas. Despite the definite advantages of DONL technology, there are potential problems that may result in failure modes and performance limitations if the overlying deposited thin film layers are not properly implemented. One important aspect of the implementation of deposited thin film layers on the surface of printed wiring board substrates is the control of mechanical stresses generated by both processing and operation. Key to control of the these stresses is understanding their sources and providing methods and structures that minimize them.

The stresses in a high density interconnect structure result from a number of sources including the differences in the coefficients of thermal expansion between the dielectric and metal materials, physical handling, and water vapor absorbed by the polymers of the dielectric materials in both the printed wiring board substrate and the deposited thin film build-up layers. Each of these stresses can be a source of failures such as cracking of the dielectric material and/or delamination of the conductive material. In either of these cases opens and shorts can destroy the functionality of the completed high density interconnect structure. The stresses associated with physical handling can be substantially eliminated through proper design of processes, operator training, and proper fixture design. Stresses related to thermal changes, however, must be minimized through proper design of the high density interconnect structure.

The stresses linked to thermal changes occur for several reasons, but the result is that stress accumulates at the interfaces between the metal conducting features and the surrounding dielectric of the high density interconnect structure. If enough stress accumulates a crack will develop that, if uninterrupted, may propagate through the overlying deposited thin film layers creating failures. While the stresses cannot altogether be eliminated, it is important, through proper design of the thin film structure, to control the stresses to eliminate or at least minimize any adverse affects that could otherwise be created by such stresses.

SUMMARY OF THE INVENTION

The present invention provides a solution to the problem of controlling the mechanical stresses at the interfaces of the metal and dielectric materials in the printed wiring substrates of high density interconnects. The invention enables the minimization of cracking due to these stresses and does so in an economically attractive process that is able to meet the needs of today's high density interconnect applications.

According to the method of the present invention, a design process is used which creates a structure that provides a stress buffer layer between the relatively coarse underlying metal features of the printed wiring board substrate and the more fragile overlying deposited thin film layers. The stress buffer layer is a 20–35 micron thick dielectric layer that acts as a physical barrier between the substrate and overlying thin film layers strengthening the overall structure, increasing its resistance to cracks and impeding propagation of any cracks started within the layer.

In one embodiment, the method of the present invention reduces mechanical stresses in a high density interconnect printed wiring board substrate having a first patterned conductive layer formed over an upper surface of the substrate. The patterned conductive layer includes multiple conductive lines each having edges that define the boundaries of the conductive lines. This embodiment of the invention forms, as the stress buffer layer, a composite dielectric layer over the first patterned conductive layer and between the edges of the conductive layer. The composite dielectric layer includes particles suspended in the layer in order to reduce the likelihood and prevent any cracks that form in the layer from propagating through the entire length of the layer. A thin film conductive layer is then formed over the composite dielectric layer, and a thin film dielectric layer is formed over the thin film conductive layer. In a preferred embodiment, the composite dielectric layer is a CIBA PROBIMER™ Layer deposited from a curtain coating process.

In another embodiment of the method of the present invention a homogenous dielectric layer is employed as the stress buffer layer. The layer buffers and diffuses any stresses generated between the underlying PWB substrate and overlying thin film interconnect layers so that the stresses do not generate stress fractures or cracks. In order for the homogenous dielectric layer to adequately diffuse stress generated during typical thermal changes the substrate is subjected to, the layer must have an elongation percentage of at least 10% and more preferably at least about 13%. In this embodiment, the stress buffering homogenous dielectric layer is formed over a patterned conductive layer that is itself formed over a printed wiring board substrate. having an upper surface of the substrate. The patterned conductive layer includes multiple conductive lines each having edges that define the boundaries of the conductive lines, and the method of this embodiment of the invention forms the homogenous dielectric layer over the conductive lines and between the edges of the conductive lines. Thin film conductive and dielectric layers are then formed over the homogeneous dielectric layer. The relatively high elongation percentage of the homogenous dielectric layer allows the layer to absorb and diffuse the stresses generated at the edges of the conductive lines thereby preventing the formation of cracks or fissures in the layer that could damage the overlying thin film interconnect structure. In a preferred embodiment, the homogenous dielectric layer is a polymide material laminated to the PWB substrate.

These and other embodiments of the present invention, as well as its advantages and features, are discussed in more detail in conjunction with the text below and attached figures.

DETAILED DESCRIPTION OF PREFERRED EMBODIMENTS

Figure 1A:
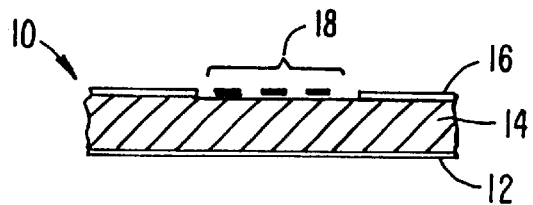
FIG. 1A is a simplified cross section of a conventional single layer printed wiring board substrate.

FIG. 1A is a simplified cross-sectional view of a high density laminated printed wiring board substrate 10. The laminated substrate is formed from a single layer of insulating material 14 such as NEMA FR4 or FR5 epoxy resin and has copper sheets 12 and 16 laminated to its lower and upper surfaces, respectively. A desired conductor pattern 18 is transferred to the copper, for example, by photolithography, then the substrate is placed in a wet chemical etch to remove the unwanted copper, leaving the desired circuit pattern. Several of these sub-laminates with the circuit patterns can be laminated together to form a multi-layer printed wiring substrate as shown in FIG. 1B.

Figure 1B:
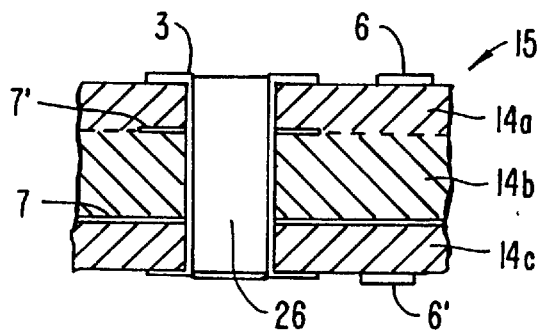
FIG. 1B is a simplified cross-sectional view of a conventional four-layer printed wiring board substrate with a plated through hole.

FIG. 1B is a simplified cross-sectional view of a four-layer printed wiring board substrate 15 which can make use of the present invention. Substrate 15 includes three sub-laminate substrate layers 14a, 14b and 14c. Layer 14b has lower and upper conductive layers 7 and 7', while layer 14a includes an upper conductive layer 6 and layer 14c includes a lower conductive layer 6'. Internal conductive layers 7 and 7' are used for power and ground planes and to provide stiffness. Plated through holes (typically filled with material 26, for example, an insulative or a conductive epoxy) form connections between the conductive layers on the upper and lower surfaces of substrate 15 while buried through vias (not shown) form connections to and between internal layers 7 and 7'. Four-layer substrates, such as substrate 15 just described with conductive layers 7, 7', 6 and 6', can be purchased from substrate manufactures such as International Business Machines Corporation (IBM) and MicroVia Corporation.

Figure 2:
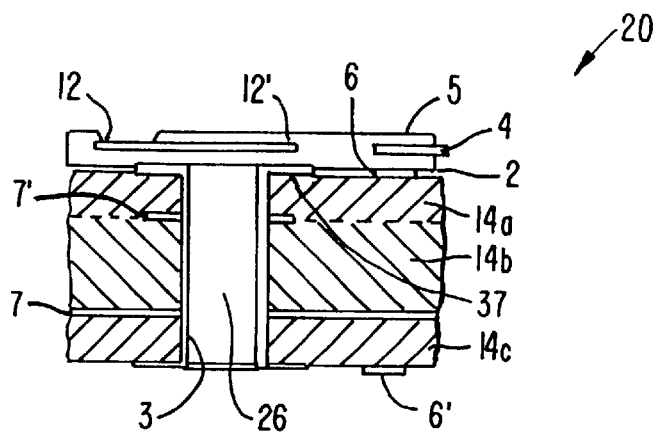
FIG. 2 is a simplified cross-sectional view of a conventional four-layer printed wiring board substrate with a single metalized build-up layer.

Shown in FIG. 2 is a typical high density interconnect structure 20 formed using DONL technology over a four-layer printed wiring substrate similar to substrate 15 in FIG. 1B. The high density interconnect structure includes a dielectric planarization layer 2, a thin film metalization layer (e.g., a chrome/copper stacked layer) 4, and a thin film dielectric passivation layer 5. It is important to note that the thicknesses of the various layers shown in FIG. 2 is not drawn to scale. In a typical, exemplary application, metalization layers 7 and 7' are about 35 microns thick and metalization layers 6 and 6' are about 20 microns thick. In contrast, and in the same exemplary application, the thin film deposited metalization layer 4 is about 5 microns thick, and the thin film deposited passivation layer 5 is 10 to 12 microns thick. A person of ordinary skill in the art will realize that the actual thicknesses of each of the above layers may vary.

Interconnects, or vias, 12' are formed between metal features 6 and 4 by photo expose and develop cycles, laser ablation or plasma etch or similar methods depending on the dielectric material used. Contact pads 12 in the top of the passivation layer 5 provide the high density solder connection pads for an integrated circuit device that can be electrically connected to substrate 20 by, for example, wire bonding or flip chip techniques as understood by a person of ordinary skill in the art. Electrical connections are made through filled plated through holes 3, which may or may not be metal capped and which are connected to pads (not shown) on the lower surface, to provide the low density solder connections pads that interface to the next level on the lower surface of four-layer substrate 20.

As was discussed above in the Background of the Invention, thin film layers on laminated printed wiring board substrates are subject to mechanical stresses. A number of sources of these stresses were described, including physical handling, thermal changes, either during operation or during the fabrication process, and outgassing of water vapor that has been absorbed into the polymers of the insulating dielectric of the printed wiring board substrate. Of particular relevance to the present invention are the accumulated stresses sourced in thermal changes.

Figure 3:
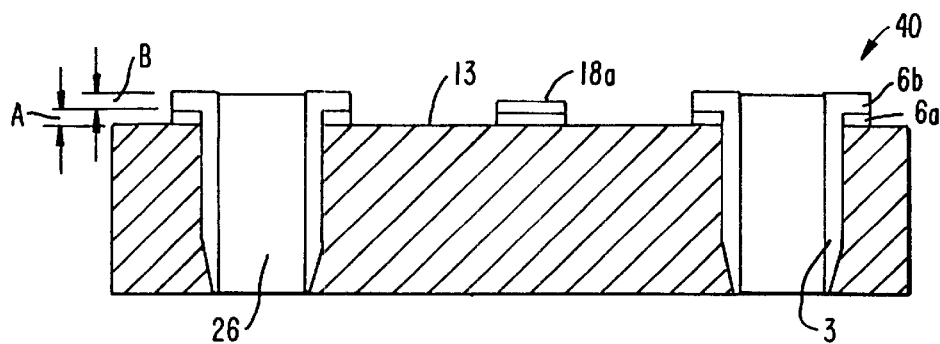
FIG. 3 is a more detailed cross-sectional view of the upper surface of a four-layer printed wiring board substrate prior to the formation of a thin film interconnect structure over the wiring board.

Recalling that the difference in thermal coefficients of expansion between the insulating and conducting materials of a high density interconnect structure is a primary source of accumulated stress, FIG. 3 provides the top surface detail of a printed wiring board substrate 40. In FIG. 3, the—surface of the substrate has had a half ounce (about 17 microns) metal foil laminated to it, as shown by layer 6a, prior to drilling the plated through holes 3. Layer 6a has a thickness of dimension A. After the plated through holes 3 have been drilled, the substrate is plated to connect the through holes 3 to the inner planes 7, 7' (FIG. 2) and to the bottom of the substrate as appropriate. The plating process adds about an additional half ounce (about 17 microns) of metal conductor, as shown by layer 6b. Layer 6b has a thickness of dimension B prior to being polished as is understood by a person of skill in the art.

The plated through holes 3 are then filled with a material 26 and polished to create a planar surface. The filling is accomplished for a number of purposes. First, in order to be able to apply a vacuum for processing the substrate the holes must be plugged. Second, filling the holes helps to minimize the surface topology easing the planarization of follow-on layers, and third, by filling the holes follow-on coats of dielectric are prevented from forming a dip over the opening of the holes. Material 26 may be either conductive, for example a conductive epoxy, or non-conductive.

After stacked layers 6a, 6b are polished, a conductor feature pattern 18a is made on the surface of the substrate, for example by photolithographic means, then the substrate is etched to create the final circuit pattern. The result of the plating on foil, polishing and etching process is a vertical surface dimension of the conductors of about 20±6 microns.

Figure 4:
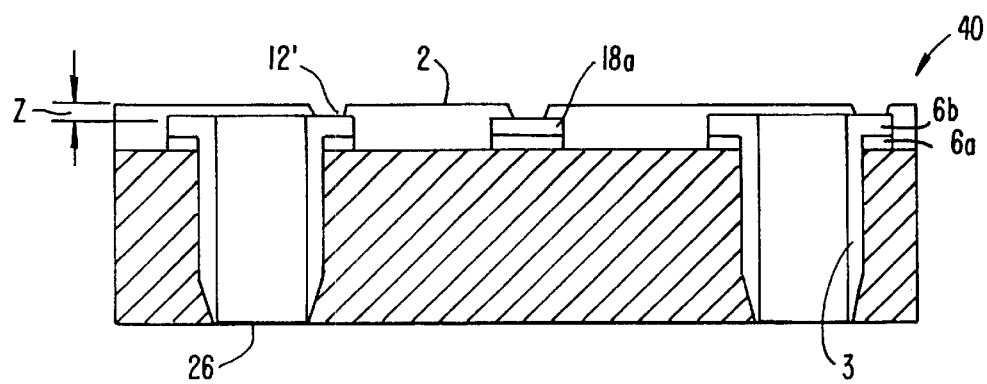
FIG. 4 is a detailed cross-sectional view of the upper surface of the substrate of FIG. 3 at an early thin film interconnect fabrication stage.

FIG. 4 is a cross-sectional view of printed wiring board substrate 40 according to the method of the present invention at a fabrication stage subsequent to the stage shown in FIG. 3. In FIG. 4, a dielectric layer 2 has been coated on the surface of substrate 40. Coating 2 planarizes the upper surface of substrate 40 for application of overlying deposited thin film metalization layers and provides a stress buffer layer between the relatively coarse features of the underlying metal layer 6a, 6b and the subsequently deposited thin film metal and dielectric layers. Thus, dielectric layer 2 is subsequently referred to as "stress buffer layer 2."

According to the present invention, stress buffer layer 2 is either a composite dielectric material or a homogenous dielectric material that has an elongation percentage of about 10–15% and preferably, at least about 13%. Stress buffer layer 2 is deposited to a thickness of at least 20 microns and at most 35 microns over the tops of the underlying coarse metal features as shown by distance Z. Even more preferably, layer 2 is between about 25–30 microns thick. At thicknesses of less than 20 microns, stress buffer layer 2 cannot adequately buffer stresses generated between the substrate and overlying thin film layers and cannot adequately insulate patterned lines 18a from the upper metalization layers. At thicknesses over 35 microns it becomes too difficult to form and fill vias in layer 2 in a cost effective manner. Within the 20–35 micron range, thicker stress buffer layer 2 has the additional benefit of strengthening the overall high density interconnect structure and decreasing the chance that any individual crack will propagate through the entire thickness of the layer. At these dimensions, the step coverage of layer 2 should be adequate providing the aspect ratio (ratio of the height to width of gaps between patterned features 18a) is less than 3:1.

By way of contrast, subsequently deposited thin film dielectric layers (e.g., layer 5 in FIGS. 6A and 6B) and subsequently deposited thin film metalization layers (e.g., layers 4 and 4' in FIGS. 6A and 6B) are significantly thinner. For example, in the preferred embodiment, subsequently deposited thin film metalization layers are between 2–5 microns thick and subsequently deposited thin film dielectric layers are between 10–16 microns thick over areas of the thin film metalization.

In embodiments of the present invention in which stress buffer layer 2 is a composite dielectric materials suspended particles in the composite material prevent or reduce the propagation of any cracks that form within the layer from traveling through the entire thickness of the layer. Because of the nature of the particles and the geometry required by layer 2, it is preferable that the particles within layer 2 be less than Z microns in diameter. In one preferred embodiment, stress buffer layer 2 is a CIBA PROBIMER™ composite dielectric material deposited by a curtain coating method. CIBA PROBIMER is available from Ciba Corporation. In addition to its composite nature, the coefficient of thermal expansion of the CIBA PROBIMER dielectric material is typically 60–70 parts per million. This is a much closer match to the typically 50–60 parts per million coefficient of thermal expansion of the Nippon Steel Chemical thin film dielectric material as compared to the 15–17 parts per million thermal coefficient of expansion of typical copper conductors and the insulating dielectric 14 of the printed wiring substrate. Thus, there is far less stress generated at the boundary between stress buffer layers and the subsequently deposited thin film dielectric layer than if the buffer layer were absent. Since the stress tends to focus at the corners of the large geometry conductors on the surface of the printed wiring board, addition of stress buffer layer 2 tends to diffuse the stress, thus transmitting less to the planarization dielectric layer above. Preferably, the CTE of stress buffer layer 2 should be as close as possible to the CTE of the underlying PWB substrate material.

In embodiments of the present invention where stress buffer layer 2 is a homogenous dielectric material, the material must have an elongation percentage of at least 10% and more preferably about 13%. Such elongation characteristics allow layer 2 to absorb some of the mechanical stresses generated by accumulated stress. In one embodiment, stress buffer layer 2 is a homogenous polymide layer that is laminated to the four-layer PWB substrate. By way of contrast, a homogenous, photo-definable dielectric material preferably used in subsequently deposited thin film dielectric layers, NIPPON STEEL CHEMICAL V-259PA (hereinafter "NIPPON STEEL"), is not appropriate to use for layer 2 according to this embodiment of the invention because its elongation percentage is about only 2.3%.

Irrespective of whether dielectric layer 2 is a composite layer or a homogenous layer, the material used to form the layer needs to have a dielectric constant of between 3.5 and 5.0 in order to adequately insulate the coarse feature metal lines from the thin film metal lines at the 20–35 micron thickness of the layer. It is also preferable that layer 2 be either a photodefinable or laser abatable material so that is can be patterned without requiring the deposition of an additional layer of resist material to form via openings 12'.

It is possible in some embodiments to have stress buffer layer 2 deposited by the four-layer printed wiring board manufacturer. These embodiments have the advantage that upon purchase of the printed wiring board substrate, the surface is ready for the immediate thin film lithography step for patterning the metalization layer. The substrate is thus received with a planarized surface and with a seed metalization in place. This reduces the number of internal thin film process steps and can lead to improved economy of manufacture.

The use of an appropriately dimensioned stress buffer layer 2 according to the present invention provides a number of advantages. First, the stress buffer layer acts as a physical isolation barrier that separates the printed wiring board substrate from the overlying deposited thin film layers. The relatively large vertical dimension of the stress buffer layer tends to diffuse stress and the strength characteristics of the stress buffer layer itself, prevents some cracks that would form in more brittle dielectric materials from forming in the present layer. Additionally, the thermal coefficients of expansion of the stress buffer layer and overlying deposited thin film layers are much more closely matched to each other than to the thermal coefficients of expansion of the printed wiring substrate. This two-fold isolation effectively minimizes cracking since the stresses are both dissipated over a greater thickness and are diffused by the dielectric properties.

Secondly and as previously stated, If stress buffer layer 2 is a composite layer the layer reduces the likelihood that any individual crack that forms in the layer will propagate through the entire thickness of the layer. The propagation of cracks is halted by the presence of particles (e.g., silicate particles) that are suspended in layer 2. Basically, if a crack forms in stress buffer layer 2 above one of the underlying coarse features and begins to propagate upward, the crack may be stopped when it encounters one of the suspended particles.

Stress buffer layer 2 also provides a highly planar surface upon which the thin film interconnect structure can be fabricated. By providing a buffer layer which is planar and absorbs stress, thinner, more uniform deposited thin film dielectric layers may be used for the deposited thin film layers. Further, since the stresses are diffused and absorbed by the buffer, a more brittle dielectric having other superior characteristics may be selected for the thin film layers. These subsequent thin film layers of dielectric and metalization have smaller topographies and thus are capable of high density interconnect patterns which reduces the total number of layers required to achieve complete connection to advanced integrated circuit input/output configurations.

Figure 5:
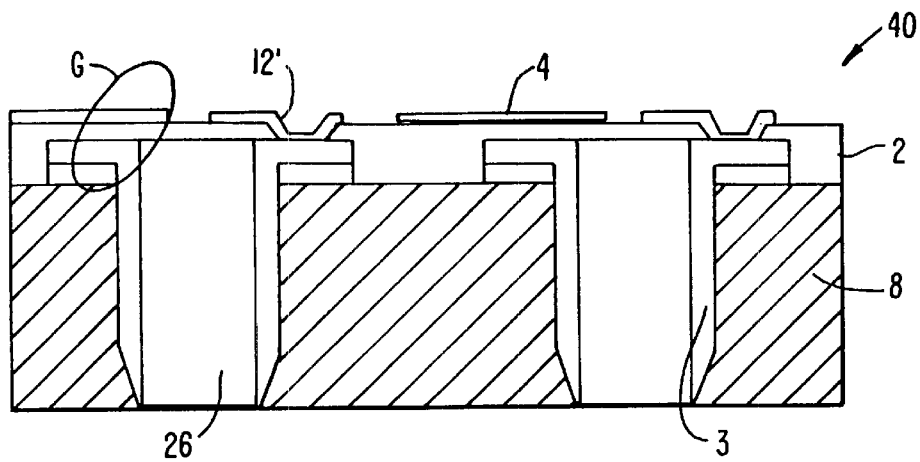
FIG. 5 is a detailed cross-sectional view of the upper surface of the substrate of FIG. 4 at a subsequent fabrication stage according to one embodiment of the method of the present invention.

FIG. 5 is a cross-sectional view of printed wiring board substrate 40 at a fabrication stage subsequent to the stage illustrated in FIG. 4. As shown in FIG. 5, a first deposited thin film metalization layer 4 has been formed on top of dielectric coating 2. Metalization layer 4 includes vias 12' and a conductor pattern 4, which in one embodiment is a ground plane deposited according to the method disclosed in commonly assigned U.S. Pat. No. 6,203,967, entitled "A METHOD FOR CONTROLLING STRESS IN THIN FILM LAYERS DEPOSITED OVER A HIGH DENSITY INTERCONNECT COMMON CIRCUIT BASE," having Scott M. Westbrook and Jan I. Strandberg listed as co-inventors and filed Jul. 31, 1998. U.S. Pat. No. 6,203,967 is hereby incorporated by reference in its entirety.

One source of stress in high density interconnects using deposited thin film layers, such as layers 2 and 4, is the large difference in the dimensions of the conductive features on the underlying printed wiring board substrate and the deposited thin film layers. With surface features of the printed wiring substrate, for example conductive feature 18a in FIG. 4, on the order of 20–35 microns and the features of the deposited thin film layer 4 on the order of 2.0–5.0 microns, this difference is almost always greater than three to one and typically up to five to one or more. Accumulated stress is focused at the corners of the relatively large surface metal features of the printed wiring board substrate. If a crack should start at such a location it will tend to propagate upwards to the overlying deposited thin film layers.

The problem of stress between the printed wiring substrate and the deposited thin film layers overlying the substrate can be minimized by providing stress buffer layer 2 as described above. Stress problems can be further mitigated in some embodiments of the invention by using metalization layer 4 as a ground plane to provide mechanical isolation of the more fragile overlying features of the high density interconnect layers. Such a ground plane layer is implemented in the initial thin film metalization layer on substrate 40 and covers as much real estate over the printed wiring board substrate as possible. One or more thin film signal layers are then formed over the ground layer. In effect, the ground plane layer creates a mechanical barrier, or shadow over the corners of the coarse surface features (e.g., plated through holes 3 and conductive lines 18a) of the printed wiring board substrate. Should a crack start at the corner of a course feature such as plated through hole 3 and propagate upward, it will meet the overlying ground plane and stop.

In one embodiment, the ground plane layer covers almost the entire surface of printed wiring board substrate 40 with the exception of areas where electrical connections between upper and lower conductive layers are made through the ground plane layer. Such connections include metal islands in the layer that are not grounded and are instead connected by vias to upper and lower layers. The more coarse feature metal edges that are covered by the ground plane layer the better. In one embodiment, 100% of the coarse feature metal edges are covered by the ground plane layer. Typically, though a substrate such as substrate 40 will have 1000 coarse feature metal edges or more. Perhaps significantly more. Benefits of the ground plane layer can still be obtained if 90%, or more preferably 95% of the total coarse feature metal edges are covered or if 90%, or more preferably 95% of the total length of all coarse feature metal edges (when summed together) is covered. In certain embodiments, the ground plane is designed to overlap the edges 16 of the coarse metal features by at least 10–100 microns and even more preferably by at least 25 microns. Further details of such a ground plane layer are described in more detail in the Ser. No. 09/127,579 application and as discussed below with respect to FIGS. 6A and 6B.

Figure 6A:
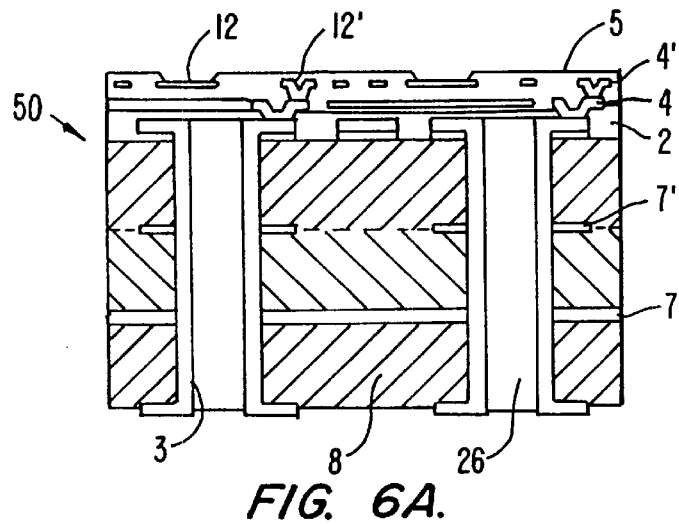
FIG. 6A is a cross-sectional view of a high density interconnect printed wiring board substrate having a conventional build-up layer on the upper surface of the substrate and thin film interconnect layers formed over the build-up layer.
Figure 6B:
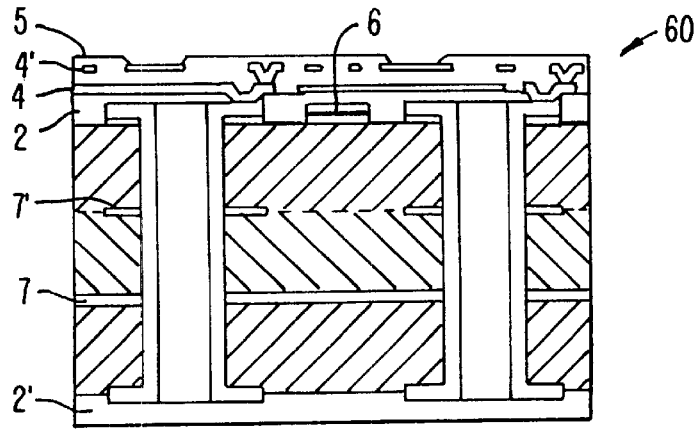
FIG. 6B is a cross-sectional view of a high density interconnect printed wiring board substrate having a conventional build-up layer on the upper surface of the substrate and thin film interconnect layers formed over the build-up layer and having a second build-up layer formed on the lower surface of the substrate.

FIGS. 6A and 6B illustrate the formation of such a buffer. In FIG. 6A substrate 50 has two deposited thin film metalization layers 4 and 4' fabricated on top of planarization layer dielectric 2. The deposited thin film metalization layers are separated by another dielectric layer, layer 5. Internal vias 12' connect the various metalization layers while solder bump pads 12 provide a mounting mechanism for an integrated circuit device. In this exemplary application solder pads 12 are used for a flip chip device. The mechanical stress buffer is formed by insuring that the deposited thin film metalization layer 4 overlaps the edges of the coarse metal features on the surface of the printed wiring substrate 50 by at least 10–100 microns and even more preferably by at least 25 microns.

Referring again to FIG. 5, the area defined by G provides a detailed view of the overlap. The corners of the coarse features of the plated through holes 3 have been overlapped, or shaded by the deposited thin film ground plane metalization layer 4. In the case of internal vias 12', the relatively fine features of the deposited thin film layer are hidden inside the corner of the plated through hole 3. As can be seen by those ordinarily skilled in the art, the same type of shading arrangement could be used for circuit patterns on the surface of the printed wiring substrate as well as for plated through holes.

Figure 7A:
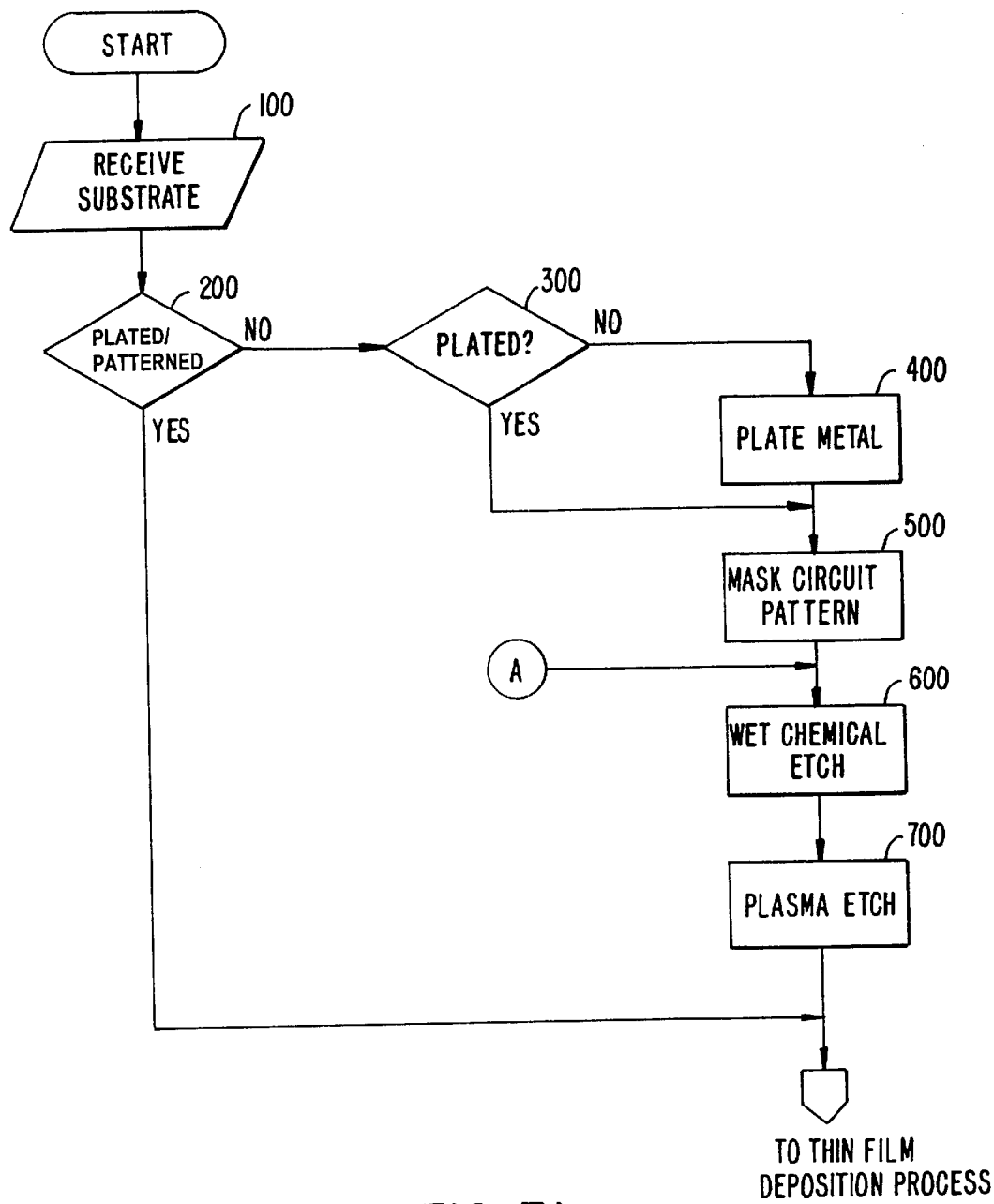
FIG. 7 is a flow chart illustrating one embodiment of the method of the present invention.
Figure 7B:
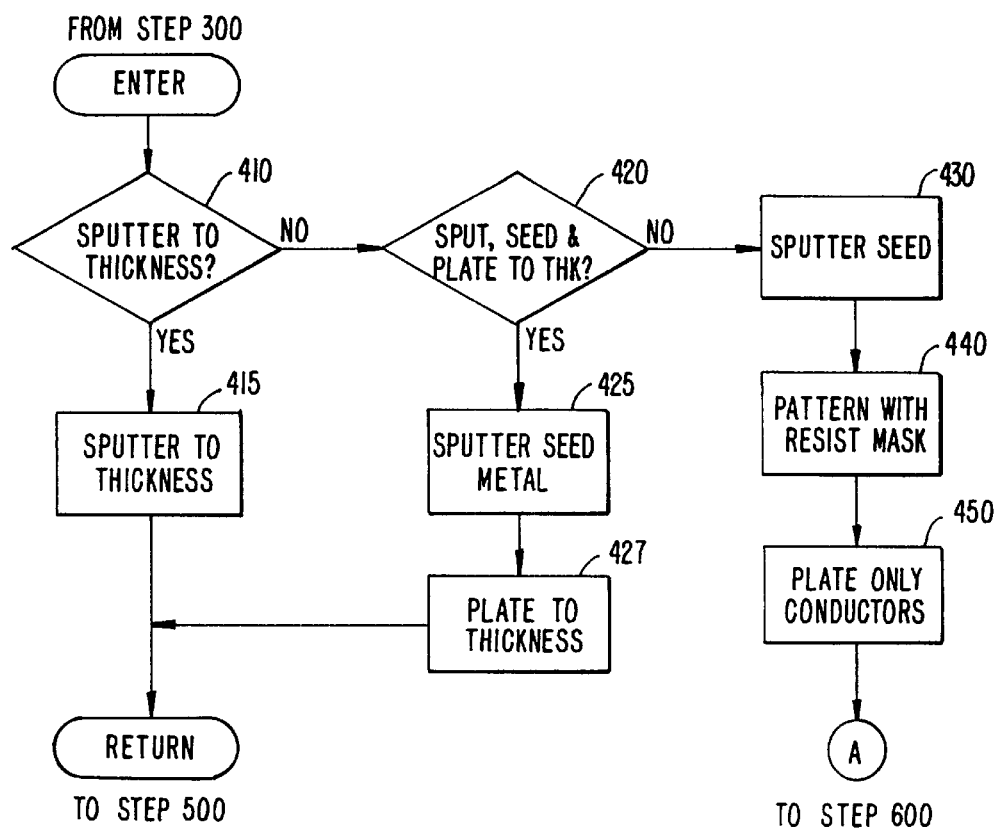

FIGS. 7A and 7B provide a flow chart showing various processing steps used to form a high density interconnect four-layer substrate in conjunction with the method of the present invention. Starting with step 100, the printed wiring substrate is received (e.g., purchased from the manufacturer) in one of three conditions: ready for further processing (i.e., plated and patterned), plated and ready for masking, or not plated at all. The three conditions provide a continuum of choices that may be used depending on the exact high density interconnect application. The first configuration is the most economical since fewer process steps are required at the deposited thin film fabrication site, however, some control of the features is lost. At the other end of the spectrum the third configuration allows for very tight control of the features using thin film deposition technology, but at an increased fabrication cost.

If the printed wiring board substrate is received in the first configuration it proceeds directly to the thin film deposition process, as shown in Step 200. If it is not, flow passes to Step 300. In step 300, if the printed wiring substrate is received with the first metal layer in place, it is sent to Step 500 for masking in preparation for etching. If the printed wiring substrate is received without the first metal layer, the flow proceeds to Step 400.

FIG. 7B contains the steps taken inside the process box of Step 400. There are three possible processes for creating the first metal layer. In Step 410 a decision is made on whether to sputter the entire first metal layer. If the outcome is yes, the first metal layer is sputtered to the proper thickness n Step 415 and the flow returns to Step 500 in FIG. 7A. If the answer is no, Step 420 makes a decision on whether to sputter only the seed and then plate to the proper thickness. If the answer is yes, Step 425 applies a seed metal and Step 427 plates the first metal layer to the proper thickness. From here flow is again returned to Step 500 in FIG. 7A. If the answer to the decision of Step 420 is no, then a seed metal is sputtered into place in Step 430. Step 440 then patterns the seed metal using cured photoresist such that in Step 450 only the conductors are plated to the proper thickness. Flow then returns to Step 600 in FIG. 7A.

Step 500 places a circuit conductor pattern on the surface of the substrate. In an exemplary application, those areas that are not to be conductive are masked, leaving the desired circuit pattern seed metal exposed. In step 600 the areas that have been left exposed are plated to the proper thickness with a conductive material, for example, copper.

The substrate then has the mask resist stripped and is immersed in a wet chemical etch in Step 600. The etch attacks all of the surface, both seed metal and plated circuit conductor patterns. But since the areas representing the circuit patterns have been plated up to a greater thickness, the seed metal is stripped completely while the circuit pattern remains. Step 700 then uses a plasma etch step to clean the remaining seed residue off the surface of the substrate.

FIGS. 6A and 6B show two embodiments of the invention. In FIG. 6A it the printed wiring substrate 30 has had a single layer of planarized CIBA PROBIMER composite dielectric 2 applied. The coat is such that the dielectric fills the spaces between the metal features on the top of the printed wiring substrate and covers the surface of the metal features, such as plated through holes 3, to a thickness of about 20–35 microns. In the preferred embodiment deposited thin film metalization layers 4 and 4' are copper, or some copper metallurgy such a chrome/copper combination. These metalization layers are separated by NIPPON STEEL CHEMICAL V-259PA homogeneous dielectric 5.

In a second preferred embodiment, as shown in FIG. 6B, the printed wiring substrate 35 has had the CIBA PROBIMOR composite electric layer 2 applied on the top surface and a mirror-CIBA PROBIMER composite dielectric layer 2' applied on the bottom surface. The bottom layer 2' provides a solder mask for solder balls that connect to conventional printed wiring board such as a mother board and helps balance the stress on the printed wiring substrate. In some conventional high density interconnect structures this balancing layer is required to prevent warping.

It can be seen by those skilled in the art that the embodiments described above are not the only possible applications of the present invention. Other equivalent or attractive methods of practicing the invention will be apparent to those of ordinary skill in the art after having read the above description of various embodiments of the invention. For example, while the details of the present invention are illustrated with respect to a printed wiring board substrate it is to be understood that the present invention can be used to reduce stress imbalances and the potentially adverse effects of such imbalances when the thin film dielectric layers and thin film metalization interconnect structures are deposited over any common circuit base. As used in this application, a common circuit base is any substrate, daughter board or multichip module upon which chip-level and/or component-level interconnects are formed. Examples of common circuit bases include printed wiring board substrates, silicon substrates, ceramic substrates and aluminum substrates among others. An integrated circuit die, itself, is not a common circuit base. Instead, the bonding pads of the die would typically be connected by a first level interconnection scheme (e.g., wire bonding, tape automated bonding, flip chip bonding, etc.) to a common circuit base that includes power and ground conductors and signal interconnection lines to connect the die to other die and/or support components such as capacitors and resistors. The method of the present invention is useful in the formation of those signal interconnection lines.

Additionally, in other embodiments of the present invention, the dielectric material in the printed wiring board substrate is Mitsubishi BT HL810 resin and the metal is half ounce (i.e., about 17 micron) copper foil. In an alternative preferred embodiment, the PWB dielectric is NEMA FR5 and the metal is the same half ounce copper foil. In other embodiments, the deposited thin film dielectric layers are formed using photo-definable cardo acrylate material other than the NIPPON STEEL CHEMICAL STEEL CHEMICAL V-259PA. homogeneous dielectric used in the preferred embodiment. Those skilled in the art will recognize that other materials than those described could be used with success using the method of the present invention. Thus, it is possible that other methods and constructions would benefit from the present invention and the only limiting factor are the claims given.

What is claimed is:

1. A method for forming a high density interconnect printed wiring board substrate having a first patterned conductive layer having a first thickness, including a plurality of conductive lines having edges that define boundaries of said conductive lines, formed over an upper surface of the substrate, said method comprising:

(a) forming a stress buffer layer directly on said first patterned conductive layer and between the edges of said first patterned conductive layer, wherein said stress buffer layer is between 20 and 35 microns thick in areas directly above said first patterned conductive layer and wherein said stress buffer layer is a single layer of either a composite dielectric layer having particles suspended in said layer or a homogenous dielectric layer having an elongation percentage of at least 10%;

(b) forming a thin film conductive layer having a second thickness directly on said stress buffer layer, wherein a ratio of said first thickness to said second thickness is at least 3:1; and (c) forming a thin film dielectric layer over said thin film conductive layer.

2. The method of claim 1 wherein said stress buffer layer is a composite dielectric layer.

3. The method of claim 2 wherein, after said composite dielectric layer is formed, vias through said composite dielectric layer are formed by a photolithographic processing sequence.

4. The method of claim 2 wherein particles suspended with in said composite dielectric layer have a diameter less than a thickness Z of said composite dielectric layer as measured over a plated throughhole.

5. The method of claim 1 wherein said stress buffer layer is a homogenous dielectric layer.

6. The method of claim, 1 wherein said stress buffer layer is a laser abatable material.

7. The method of claim 1 wherein said stress buffer layer is deposited to a thickness of between 25–30 microns over said first patterned conductive layer.

8. The method of claim 7 wherein said thin film dielectric layer is deposited to a thickness of between about 10 and 16 microns.

9. The method of claim 1 wherein said stress buffer layer comprises a homogenous polymide dielectric material.

10. The method of claim 1 wherein said stress buffer layer comprises a homogenous dielectric layer having an elongation percentage of at least about 13%.

11. The method of claim 1 wherein said thin film conductive layer is between 2 and 5 microns thick and wherein said first patterned conductive layer is between 14 and 26 microns thick.

12. The method of claim 1 wherein said stress buffer layer is a photodefinable material.

13. A method for fabricating a high density interconnect substrate, said method comprising:

(a) providing a high density interconnect printed wiring board substrate having a first patterned conductive layer having a first thickness, including a plurality of conductive lines having edges that define boundaries of said conductive lines, formed over an upper surface of the substrate and having a composite dielectric layer having particles suspended therein formed over said first patterned conductive layer and between the edges of said conductive layer, (b) forming a thin film conductive layer having a second thickness over said composite dielectric layer, wherein a ratio of said first thickness to said second thickness is at least 3:1; and (c) forming a thin film dielectric layer over said thin film conductive layer;

wherein said thin film conductive layer is between 2 and 5 microns thick and wherein said first patterned conductive layer is between 14 and 26 microns thick.

14. The method of claim 13 wherein said composite dielectric layer is a photodefinable material.

15. The method of claim 13 wherein said composite dielectric layer is a laser abatable material.

16. The method of claim 13 wherein said composite dielectric layer is deposited to a thickness of between 25–30 microns over said first patterned conductive layer.

17. The method of claim 16 wherein said thin film dielectric layer is deposited to a thickness of between about 10 and 16 microns.

18. The method of claim 13 wherein said particles suspended with in said composite dielectric layer have a diameter less than a thickness Z of said composite dielectric layer as measured over a plated throughhole.

19. The method of claim 18 wherein Z is between 20–35 microns.

20. A method of forming high density interconnect structure over a common circuit base having an upper major surface, a lower major surface and a thick film patterned conductive layer having a first thickness formed on said upper major surface, said thick film patterned conductive layer forming a plurality of thick film conductive lines having edges that define boundaries of said conductive lines, said method comprising:

(a) forming a stress buffer layer on said plurality of thick film conductive lines, wherein said stress buffer layer is a single, composite dielectric layer having particles suspended in said layer;

(b) forming a thin film conductive layer having a second thickness on said stress buffer layer, wherein a ratio of said first thickness to said second thickness is at least 3:1; and;

(c) forming a thin film dielectric layer over said thin film conductive layer.

21. The method of claim 20 wherein said thin film conductive layer is a ground plane layer that overlaps at least 90 percent of a total length of all of said edges by at least 10 microns.

22. The method of claim 21 wherein a second thin film signal-carrying conductive layer is formed over said thin film dielectric layer and a second thin film dielectric layer is formed over said second thin film conductive layer.

23. The method of claim 20 wherein said thick film conductive layer has a first coefficient of thermal expansion, said thin film dielectric layer has a second coefficient of thermal expansion and said stress buffer layer has a third coefficient of thermal expansion, and wherein said third coefficient of thermal expansion is closer to said second coefficient of thermal expansion than said first coefficient of thermal expansion.

24. The method of claim 20 wherein said ratio of said first thickness to said second thickness is at least 5:1.

25. A method of forming a high density interconnect structure over a common circuit base having an upper major surface, a lower major surface and a thick film patterned conductive layer having a first thickness formed on said upper major surface, said thick film patterned conductive layer forming a plurality of thick film conductive lines having edges that define boundaries of said conductive lines, said method comprising:

(a) forming a stress buffer layer on said plurality of thick film conductive lines, wherein said stress buffer layer is a single homogenous dielectric layer having an elongation percentage of at least 10%;

(b) forming a thin film conductive layer having a second thickness on said stress buffer layer, wherein a ratio of said first thickness to said second thickness is at least 3:1; and (c) forming a thin film dielectric layer over said thin film conductive layer.

26. The method of claim 25 wherein said thin film conductive layer is a ground plane layer that overlaps at least 90 percent of a total length of all of said edges by at least 10 microns.

27. The method of claim 26 wherein a second thin film signal-carrying conductive layer is formed over said thin film dielectric layer and a second thin film dielectric layer is formed over said second thin film conductive layer.

28. The method of claim 25 wherein said thick film conductive layer has a first coefficient of thermal expansion, said thin film dielectric layer has a second coefficient of thermal expansion and said stress buffer layer has a third coefficient of thermal expansion, and wherein said third coefficient of thermal expansion is closer to said second coefficient of thermal expansion than said first coefficient of thermal expansion.

29. The method of claim 25 wherein said ratio of said first thickness to said second thickness is at least 5:1.

30. The method of claim 25 wherein said stress buffer layer has an elongation percentage of at least 13%.

* * * * *